(12) United States Patent
Ball

(10) Patent No.: US 10,212,863 B1
(45) Date of Patent: Feb. 19, 2019

(54) SLOTTED FABRIC OVER FOAM ELECTROMAGNETIC INTERFERENCE GASKETS

(71) Applicant: Laird Technologies, Inc., Chesterfield, MO (US)

(72) Inventor: Shelby Ball, Frisco, TX (US)

(73) Assignee: Laird Technologies Inc., Chesterfield, MO (US)

( * ) Notice: Subject to any disclaimer, the term of this patent is extended or adjusted under 35 U.S.C. 154(b) by 0 days.

(21) Appl. No.: 15/928,309

(22) Filed: Mar. 22, 2018

Related U.S. Application Data

(60) Provisional application No. 62/619,523, filed on Jan. 19, 2018.

(51) Int. Cl.
*H05K 9/00* (2006.01)

(52) U.S. Cl.
CPC ........... *H05K 9/0015* (2013.01); *H05K 9/009* (2013.01)

(58) Field of Classification Search
CPC .................................................... H05K 9/0015
See application file for complete search history.

(56) References Cited

U.S. PATENT DOCUMENTS

| | | | |
|---|---|---|---|
| 5,511,798 A | 4/1996 | Kawamoto et al. | |
| 5,578,790 A * | 11/1996 | Peregrim | H05K 9/0015 174/356 |
| 7,112,740 B2 * | 9/2006 | Van Haaster | H05K 9/0016 174/355 |
| 7,763,810 B2 | 7/2010 | van Haaster | |
| 2006/0081389 A1 * | 4/2006 | Pille | H05K 5/0243 174/381 |
| 2008/0083562 A1 * | 4/2008 | Kuczynski | H05K 9/0015 174/350 |
| 2009/0000818 A1 * | 1/2009 | Poulsen | H05K 9/0015 174/370 |
| 2014/0203069 A1 * | 7/2014 | Wang | H05K 1/0306 228/256 |
| 2014/0216806 A1 * | 8/2014 | Poulsen | H05K 9/0015 174/351 |

FOREIGN PATENT DOCUMENTS

WO   WO-9922555 A1   5/1999

* cited by examiner

*Primary Examiner* — Hung V Ngo
(74) *Attorney, Agent, or Firm* — Harness, Dickey & Pierce, P.L.C.; Anthony G. Fussner

(57) ABSTRACT

An electromagnetic interference (EMI) shielding gasket is disclosed, the gasket having a series of slots thereon. The gasket may include an electrically-conductive outer layer adhered to a resiliently compressible core, and may further include a pressure sensitive adhesive thereon for adhering the gasket to a substrate. Each slot is a portion of the gasket that has been removed from the gasket by, for example, cutting a portion of the outer layer and core and removing a substantial majority of the core and all but the base of the gasket, thereby leaving a strip of electrically-conductive outer layer in each slot.

17 Claims, 11 Drawing Sheets

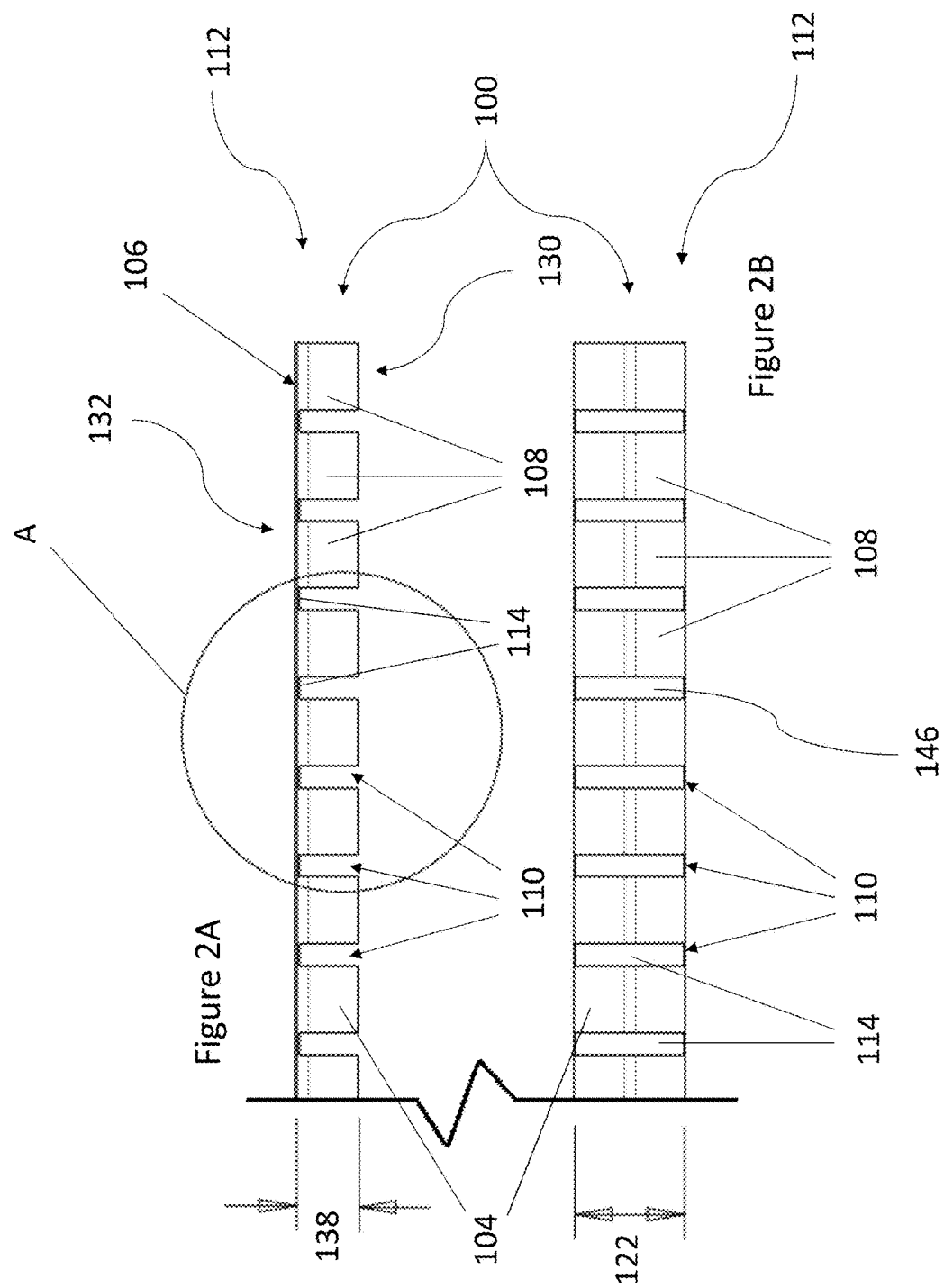

SLOTTED FABRIC OVER FOAM ELECTROMAGNETIC INTERFERENCE GASKETS

CROSS-REFERENCE TO RELATED APPLICATION

This application claims priority to and the benefit of U.S. Provisional Patent Application No. 62/619,523 filed Jan. 19, 2018. The entire disclosure of the above application is incorporated herein by reference.

FIELD

The present disclosure includes fabric over foam gaskets for the mitigation of electromagnetic interference (EMI) in electronics.

BACKGROUND

This section provide background information related to the present disclosure which is not necessarily prior art.

During normal operation, electronic equipment can generate undesirable electromagnetic energy that can interfere with the operation of proximately located electronic equipment due to electromagnetic interference (EMI) transmission by radiation and conduction. The electromagnetic energy can be of a wide range of wavelengths and frequencies. To reduce the problems associated with EMI, sources of undesirable electromagnetic energy may be shielded and electrically grounded. Shielding can be designed to prevent both ingress and egress of electromagnetic energy relative to a housing or other enclosure in which the electronic equipment is disposed. Since such enclosures often include gaps or seams between adjacent access panels and around doors and connectors, effective shielding can be difficult to attain because the gaps in the enclosure permit transference of EMI therethrough. Further, in the case of electrically-conductive metal enclosures, these gaps can inhibit the beneficial Faraday Cage Effect by forming discontinuities in the conductivity of the enclosure which compromise the efficiency of the ground conduction path through the enclosure. Moreover, by presenting an electrical conductivity level at the gaps that is significantly different from that of the enclosure generally, the gaps can act as slot antennae, resulting in the enclosure itself becoming a secondary source of EMI.

EMI gaskets have been developed for use in gaps and around doors to provide a degree of EMI shielding while permitting operation of enclosure doors and access panels and fitting of connectors. To shield EMI effectively, the gasket should be capable of absorbing or reflecting EMI as well as establishing a continuous electrically-conductive path across the gap in which the gasket is disposed. These gaskets can also be used for maintaining electrical continuity across a structure and for excluding from the interior of the device such contaminates as moisture and dust. Once installed, the gaskets essentially close or seal any interface gaps and establish a continuous electrically-conductive path thereacross by conforming under an applied pressure to irregularities between the surfaces. Accordingly, gaskets intended for EMI shielding applications are specified to be of a construction that not only provides electrical surface conductivity even while under compression, but which also has a resiliency allowing the gaskets to conform to the size of the gap.

As used herein, the term "EMI" should be considered to generally include and refer to EMI emissions and radio frequency interference (RFI) emissions, and the term "electromagnetic" should be considered to generally include and refer to electromagnetic and radio frequency from external sources and internal sources. Accordingly, the term shielding (as used herein) generally includes and refers to EMI shielding and RFI shielding, for example, to prevent (or at least reduce) ingress and egress of EMI and RFI relative to a housing or other enclosure in which electronic equipment is disposed.

SUMMARY

This section provides a general summary of the disclosure, and is not a comprehensive disclosure of its full scope or all of its features.

An electromagnetic interference (EMI) shielding gasket is disclosed, the gasket having a series of slots thereon. The gasket may include an electrically-conductive outer layer adhered to a resiliently compressible core, and may further include a pressure sensitive adhesive thereon for adhering the gasket to a substrate. Each slot is a portion of the gasket that has been removed from the gasket by, for example, cutting a portion of the outer layer and core and removing a substantial majority of the core and all but the base of the gasket, thereby leaving a strip of electrically-conductive outer layer in each slot.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 2A is a side view of an end portion of an embodiment of a fabric-over-foam slotted gasket of the disclosure.

FIG. 2B is a top down view of an end portion of an embodiment of a fabric-over-foam slotted gasket of the disclosure.

Corresponding reference numerals indicate corresponding parts throughout the several views of the drawings.

DETAILED DESCRIPTION

Example embodiments will now be described more fully with reference to the accompanying drawings.

A fabric-over-foam (FOF) EMI gasket is disclosed herein, the gasket being of indefinite length (as the gasket may be provided in various lengths depending, for example, upon the particular installation or end use intended for the gasket). The gasket of the disclosure includes, in an exemplary embodiment, segments of metallized electrically-conductive fabric over foam joined at their bases by segments of metallized electrically-conductive fabric. In this way, the gasket may be considered as having alternating regions of fabric-over-foam and metallized fabric, these regions meeting at their bases to form a continuous bottom of the gasket.

Figure 1A:
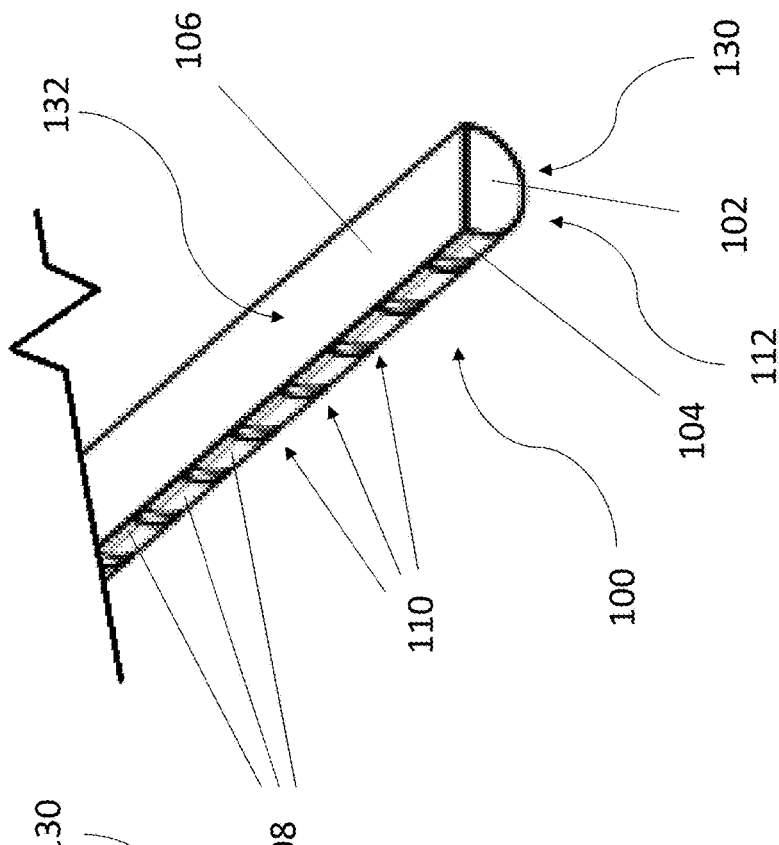
FIG. 1A is an elevated perspective view of an end portion of an embodiment of a fabric-over-foam slotted gasket of the disclosure.
Figure 1B:
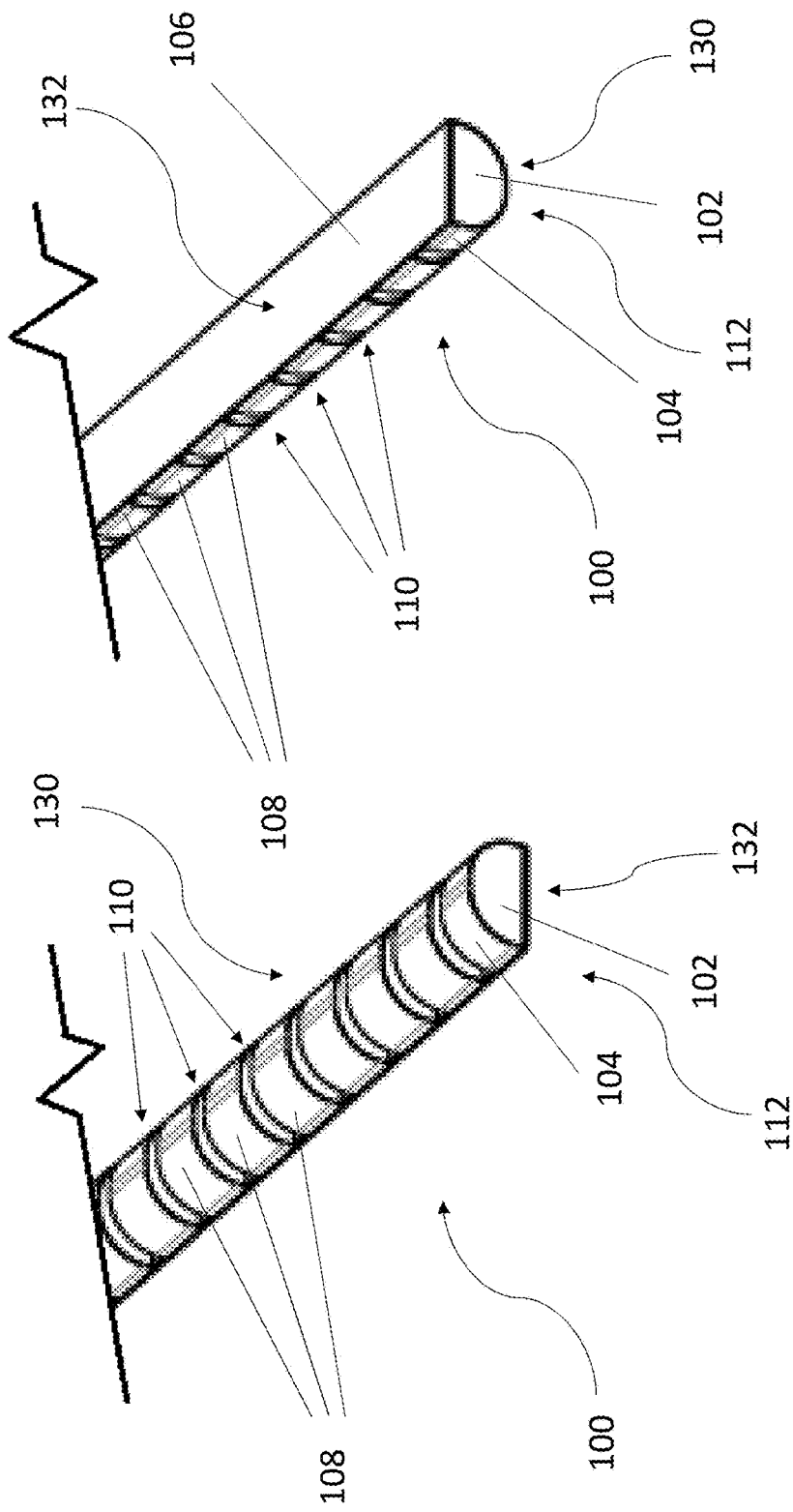
FIG. 1B is a lower perspective view of an end portion of an embodiment of a fabric-over-foam slotted gasket of the disclosure.

Turning to the figures, FIG. 1A shows an elevated perspective view of an embodiment of a fabric-over-foam slotted gasket 100 of the disclosure. In this view, the end portion 112 of the gasket, seen looking down onto the top 130 thereof, the electrically-conductive foam 102 is visible, the foam wrapped in electrically-conductive fabric 104. A series of fabric-over-foam sections 108, each comprising foam 102 wrapped in fabric 104 is visible, where between each FOF section is a slot 110. FIG. 1B shows a lower perspective view of the end of the gasket of FIG. 1A, where here the bottom 132 of the gasket is visible, where in this embodiment a strip of pressure sensitive adhesive (PSA) 106 is present. In an embodiment, the PSA is conductive. The PSA may include a removable release liner that protects the PSA until attachment to a substrate.

FIGS. 2A and 2B show additional views of the FOF gasket 100 of FIGS. 1A and 1B, where FIG. 2A is a side view of an end portion 112 of the gasket and FIG. 2B is a top down view. FIGS. 2A and 2B show the alternating sections of FOF 108 and slots 110 therebetween. FIGS. 2A and 2B further show sections of slot fabric 114 between and joining the FOF sections 108, these sections of fabric residing in the slots 110. The gasket 100 has a height 138 and a width 122, where the width in this embodiment is widest at the base of the gasket due to the shape of the profile of the face of the gasket.

Figure 3:
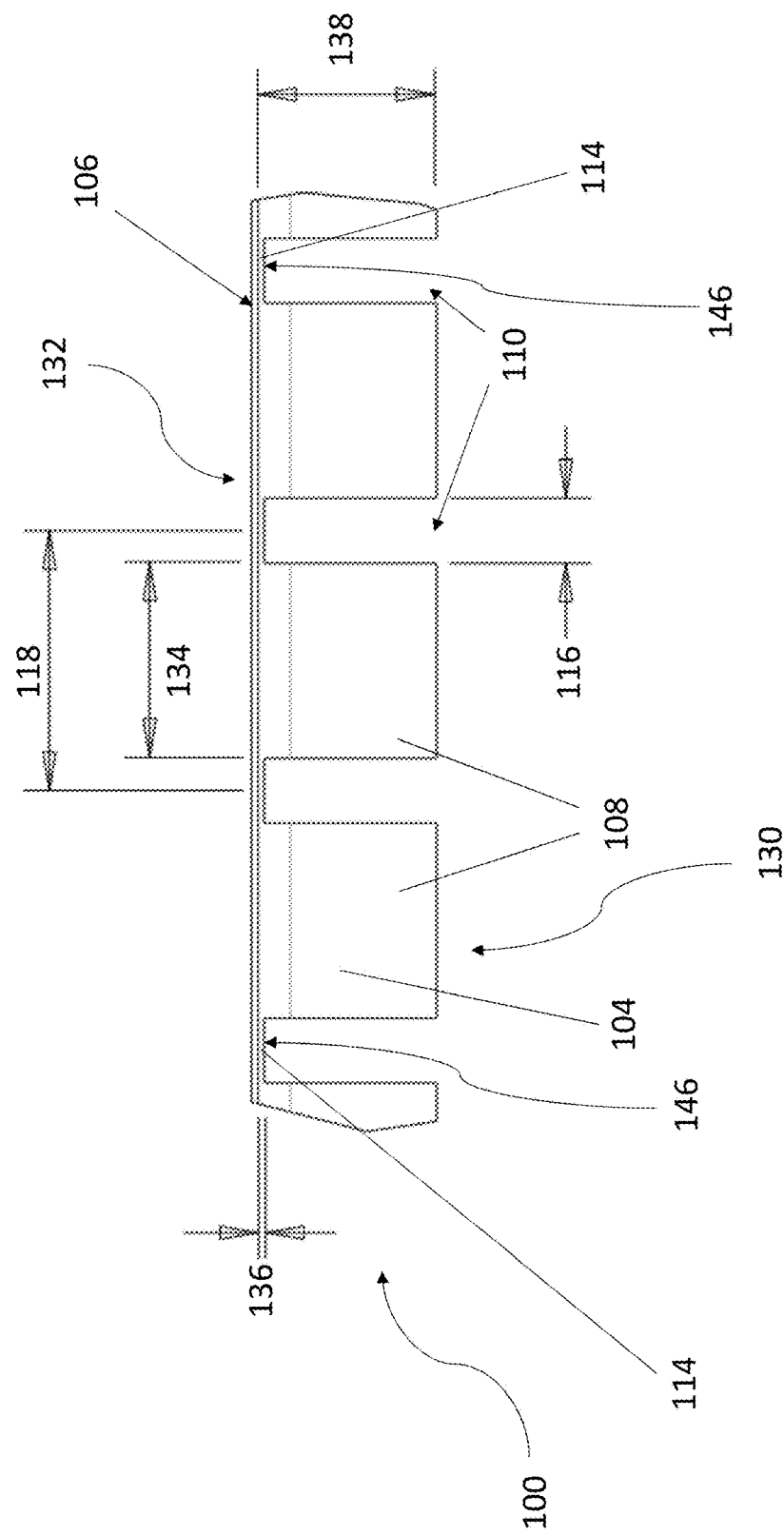
FIG. 3 is a close-up view of an embodiment of a fabric-over-foam slotted gasket of the disclosure, this view generally showing a detailed view of region A, as circled in FIG. 2A.

The slot fabric 114 can be seen in more detail in FIG. 3, which is a close-up view of an embodiment of a fabric-over-foam slotted gasket of the disclosure, this view generally showing a detailed view of region A, as circled in FIG. 2A. The FOF sections 108 each have a height 138, and the slot fabric 114 also has a small height 136 relative to both the depth of the slot and the height of the FOF, that height 136 is substantially the same as the thickness of the fabric 104 wrapped around the gasket. FIG. 3 further indicates the location of a potential byproduct of an embodiment of a manufacturing process of a gasket of the disclosure, a region of residual foam 146 along the fabric 114 between the FOF sections 108 and in the slots 110. This residual foam 146 is a non-functional remainder of foam core adhered to the outer conductive layer that remains attached thereto after a step of the manufacturing process, but might increase the height 136 of the gasket 100 in the slots 110.

As shown in FIG. 3, each slot 110 has a length or width 116 (broadly, a dimension in a longitudinal or lengthwise direction along the gasket), which might be in an embodiment consistent or uniform (e.g., about equal, etc.) throughout the length of the gasket 100. Alternatively, the width or length 116 of each slot 110 may be inconsistent or nonuniform (e.g., may vary, etc.) throughout the length of a gasket in another embodiment. For example, the widths of the slots may vary and be adjusted, tailored, or customized to fit or to accommodate a specific application or end use. Similarly, each FOF section 108 has a length or width 134 (broadly, a dimension in a longitudinal or lengthwise direction along the gasket), which might be in an embodiment consistent or uniform (e.g., about equal, etc.) throughout the length of the gasket 100. Alternatively, the width or length 134 of each FOF section 108 may be inconsistent or nonuniform (e.g., may vary, etc.) throughout the length of a gasket in another embodiment. For example, the widths of the FOF sections may vary and be adjusted, tailored, or customized to fit or to accommodate a specific application or end use.

The width 116 of the slot and the width 134 of an adjacent FOF section together make a unit width or length 118 (broadly, a dimension in a longitudinal or lengthwise direction along the gasket). In FIG. 3, the unit length 118 is shown as running from the midpoints of slots 110 on both sides of an FOF section 108.

Figure 4:
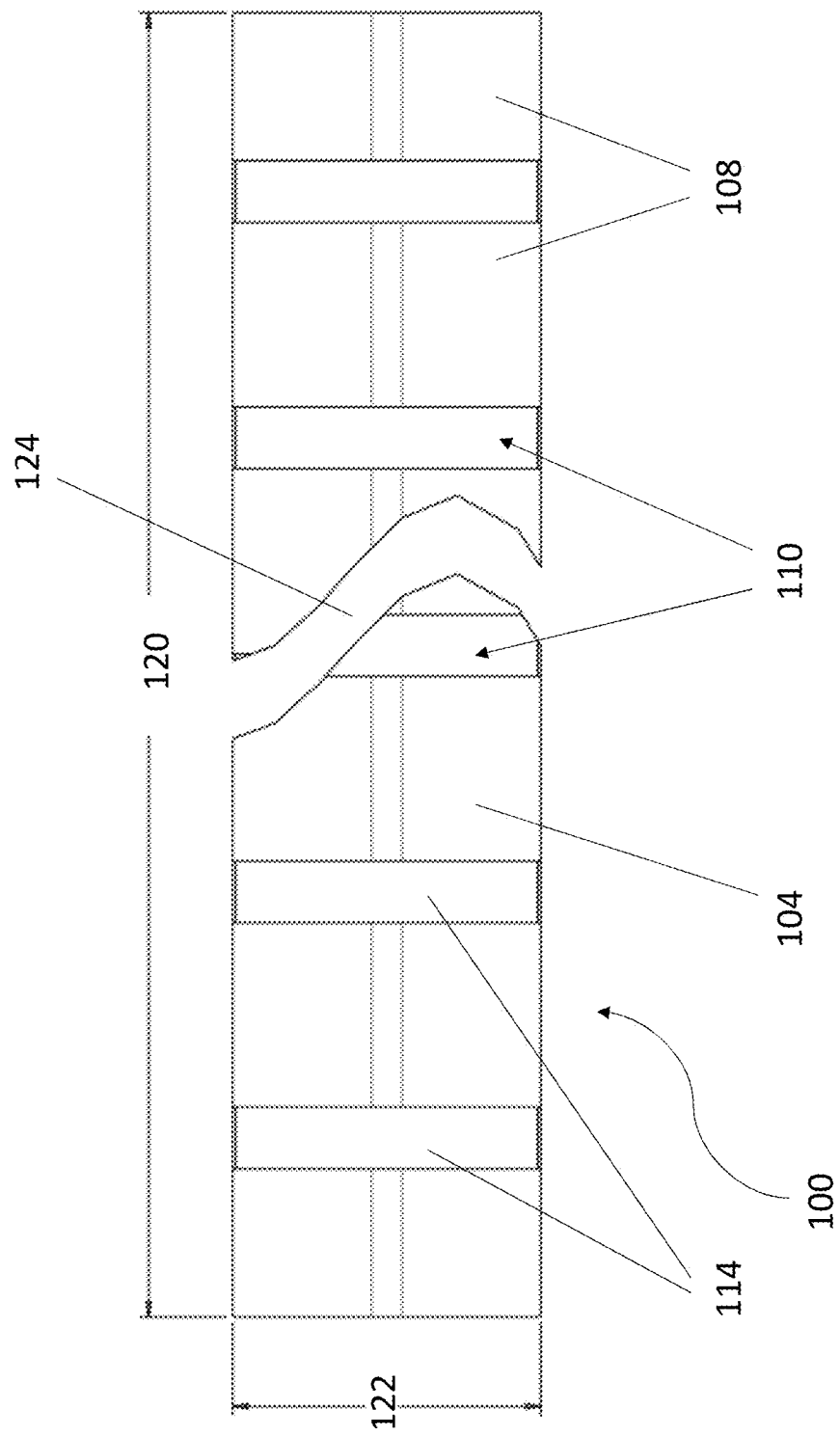
FIG. 4 is a top down view of an entire length of an embodiment of a fabric-over-foam slotted gasket of the disclosure, this view including a cutaway region in the middle of the gasket.

FIG. 4 is a top down view of an entire length of an embodiment of a fabric-over-foam slotted gasket 100 of the disclosure, this view including a cutaway region 124 in the middle of the gasket of indefinite length so as to illustrate a full gasket. In an embodiment, the gasket 100 is of an indefinite length 120, where the length of a gasket may be of any suitable length as needed for any particular application, and this disclosure embraces a gasket of any indefinite length 120. Additionally, the gasket width 122 may be consistent throughout the length of the gasket to as to give a substantially rectangular footprint. Alternatively, the gasket width may be inconsistent or nonuniform throughout the length of a gasket in another embodiment.

Figure 5:
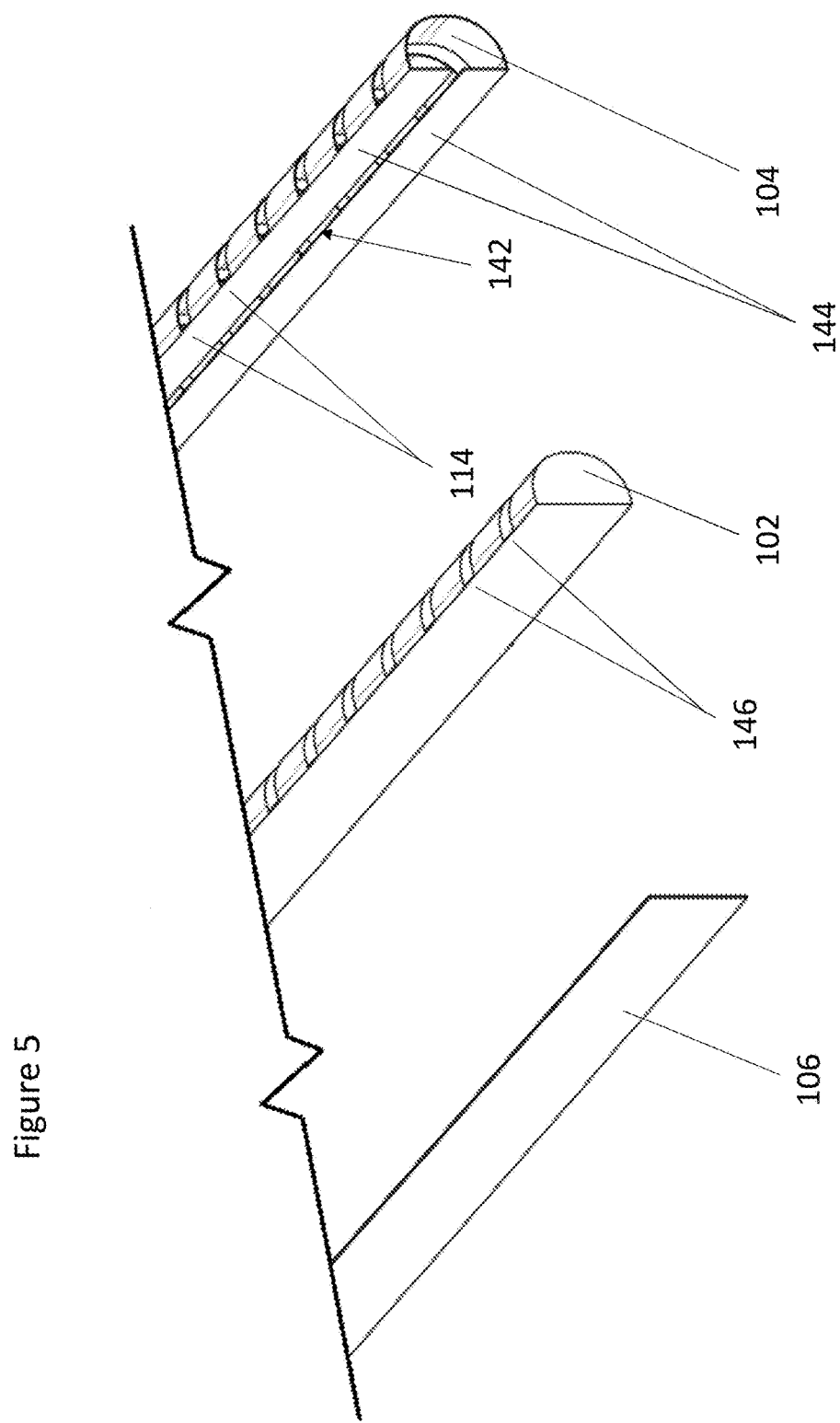
FIG. 5 is an exploded lower side view of an end portion of an embodiment of a fabric-over-foam slotted gasket of the disclosure.

FIG. 5 shows an exploded lower side view of an end portion of an embodiment of a fabric-over-foam slotted gasket of the disclosure. Here the PSA 106 is shown as having a substantially rectangular footprint. The conductive foam 102 is also shown with, for non-limiting illustrative purposes, both the foam within the FOF sections as well as the residual foam 146 therebetween that would reside on the slot fabric 114. The conductive fabric 104 includes in this embodiment bottom portions 144 of conductive outer layer that run the length of the bottom of the gasket but do not meet, leaving a region of non-overlap 142. In an embodiment, the bottom portions of the conductive outer layer meet at their respective edges to form a seam that runs along the bottom of the gasket. In another embodiment, the bottom portions of conductive fabric overlap on the underside of the gasket. However, in this embodiment seen in FIG. 5, as well as in some subsequent figures, these bottom portions do not meet but instead leave a non-overlap region between them.

In an embodiment, the conductivity of the gasket from the top 130 to the bottom 132 is not impacted by whether or not the bottom portions of the conductive outer layer meet, it might be undesirable to have an overlap thereof for risk of increasing the height of the gasket, where a gap may ensure that no incidental overlapping of the conductive outer layer occurs when attempting to snugly mate their edges during a high-speed manufacturing process. Thus, the gap 142 between the edges of the bottom portions 144 of the outer conductive layer 104 may serve as a margin for error in a high-speed FOF manufacturing process where both vertical conductivity and consistent height throughout the length of the gasket are required.

Figure 6:
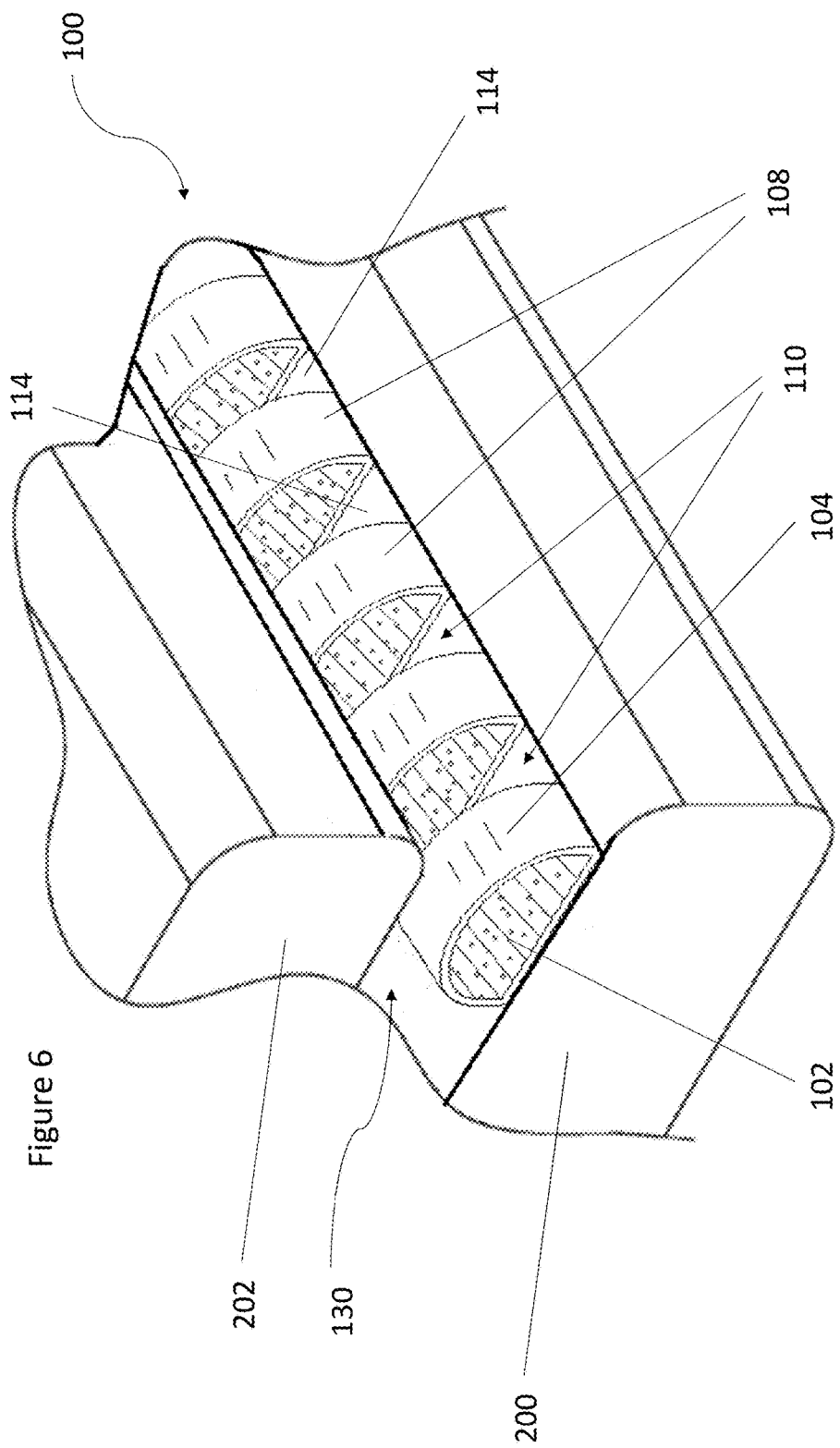
FIG. 6 is an elevated perspective view of an embodiment of a fabric-over-foam slotted gasket of the disclosure mounted on a first substrate, between the first substrate and a second substrate, and in an uncompressed state.
Figure 7:
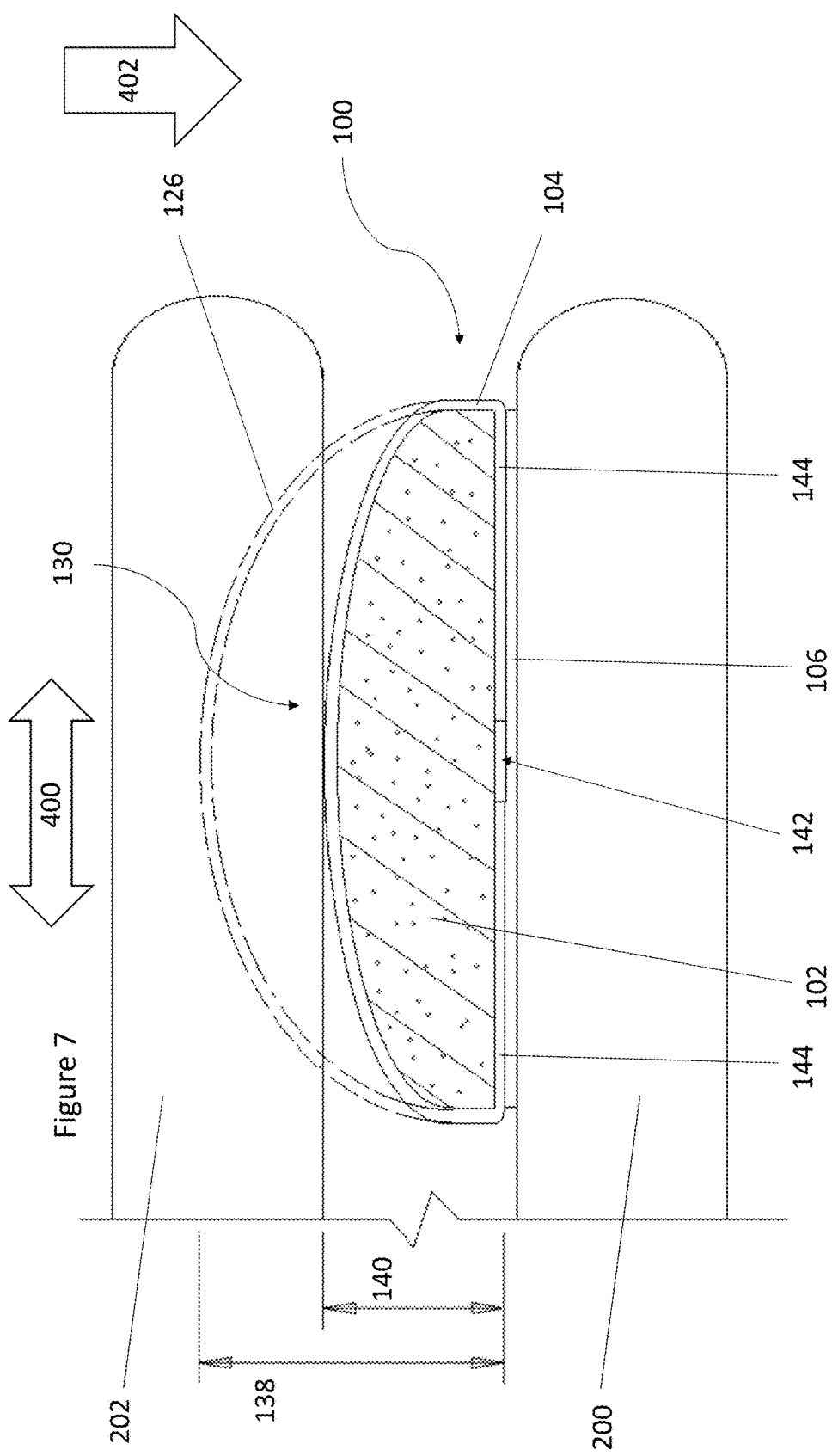
FIG. 7 is an end view of the gasket and substrates of FIG. 6, where the gasket is in a compressed state, with an outline showing the uncompressed state for comparison.

FIG. 6 is an elevated perspective view of an embodiment of a fabric-over-foam slotted gasket 100 of the disclosure mounted on a first substrate 200, between the first substrate and a second substrate 202, and in an uncompressed state. FIG. 7 is an end face view of the gasket 100 and substrates 200, 202 of FIG. 6, in a compressed state, with an outline 126 showing the uncompressed state for comparison. In this embodiment, the introduction of the second substrate 202 to the gasket 100 and first substrate 200 may be in a variety of ways. In one way, the second substrate may move in a downwardly compressing direction 402 such that the second substrate compresses onto the top 130 of the gasket, causing the FOF sections to compress from an uncompressed height 138 down to a shorter compressed height 140. In another way, the second substrate may be introduced in a shearing direction 400 that approaches the gasket 100 from a side, causing the FOF sections to compress from an uncompressed height 138 down to a shorter compressed height 140. In these directions, for example, the second substrate may be introduced to and removed from the gasket 100 a series of times, as the end application of the gasket may dictate. For example, the gasket of the disclosure could line the outer perimeter of a metal can wall, and an overlapping can lid could be sheared down over the can wall and gasket, perhaps repeatedly for intermittent access to the can contents. Where a shearing direction 400 is used, the gasket should be able to withstand multiple shears of the gasket, which can be achieved, for example, by having a gasket with a generally rounded profile such as a tombstone or semicircle or capital D shape or similar shape known by those of ordinary skill in the art. Additionally, the outer conductive layer should, in a shearing-type application, be of sufficiently resilient makeup as to withstand repeated shearing forces from a substrate. Similarly, the PSA 106 should have sufficient adhesion strength to withstand repeated shearing, such that the PSA and/or bottom of the gasket should not detach from the first substrate under the stresses of one or more shearing forces.

Figure 8:
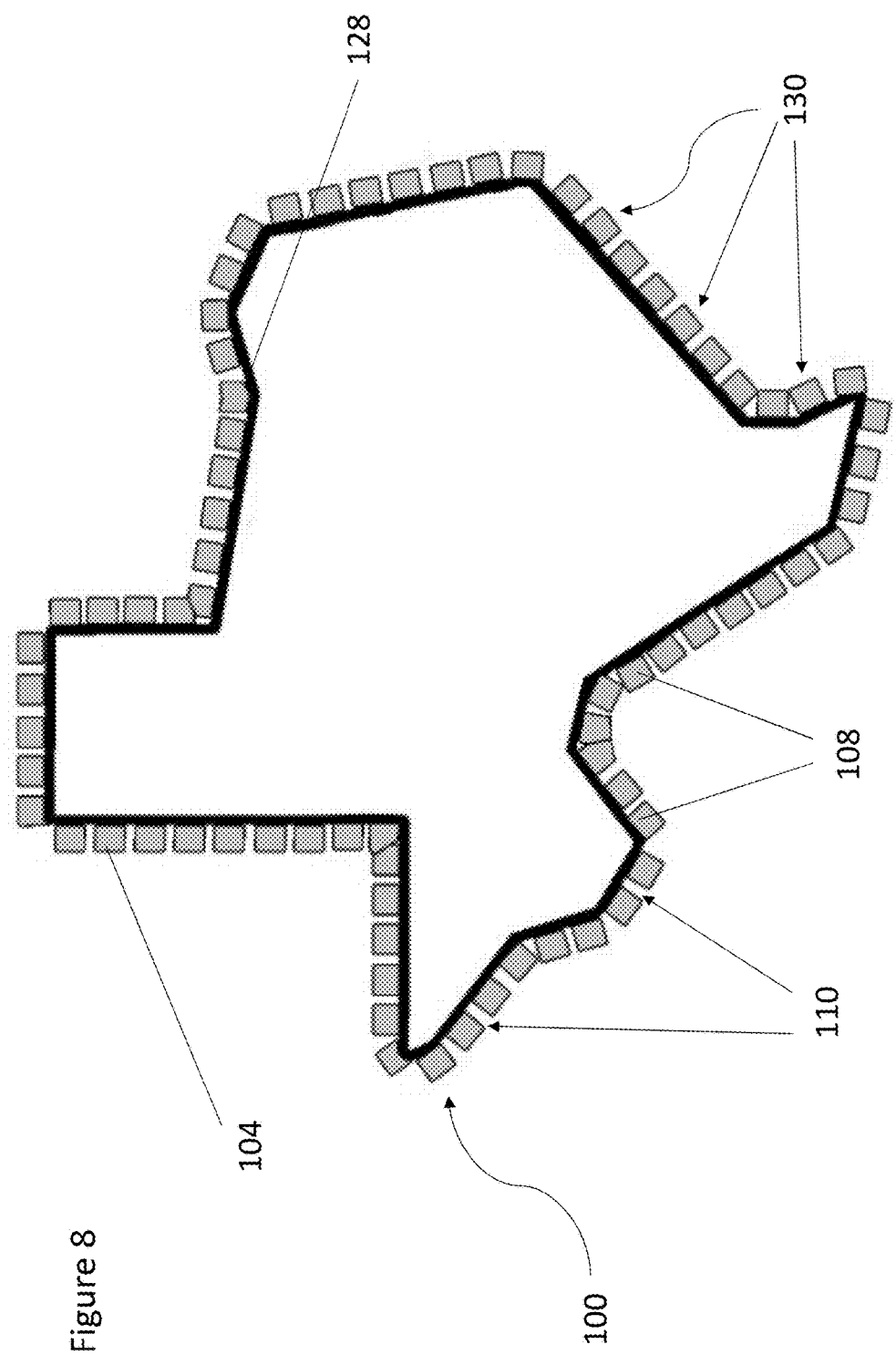
FIG. 8 is a top down view of a metal can having a perimeter of various angles along its contour, the can having a gasket of the disclosure wrapped around its perimeter wall.

FIG. 8 is a top down view of a metal can having a perimeter of various angles and contours along its circumference, the can having a gasket of the disclosure wrapped around its perimeter wall. This Figure speaks to the diversity of the gasket 100 of the disclosure in that it may wrap around a metal can 128 having a variety of shapes, including 90 degree turns that are both convex and concave, and yet maintain adherence to the can and resist repeated shearing forces down onto the gasket when a lid that overlaps the can is lifted and closed against the FOF sections 104 of the gasket. A typical unslotted FOF gasket, for comparative example, might pinch and deform around corners or fail under repeated shearing forces.

Figure 9:
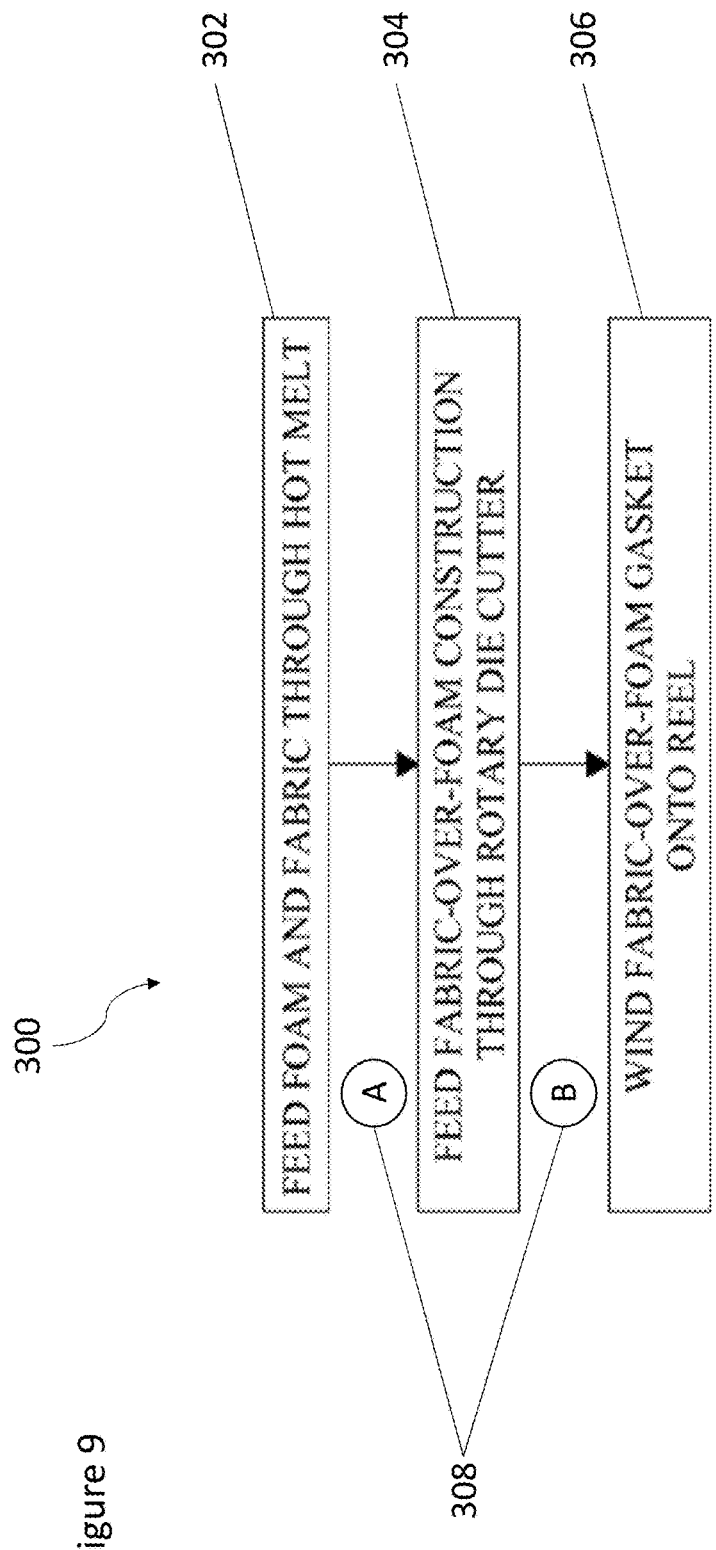
FIG. 9 is a process flow diagram of an exemplary method of making a fabric-over-foam gasket according to exemplary embodiments.

FIG. 9 is a process flow diagram of an exemplary method of making a fabric-over-foam gasket according to exemplary embodiments. In the exemplary method 300 shown in this Figure, in a first step 302 a resilient foam core and a conductive outer layer, represented in this Figure by foam and fabric, are fed through a machine whereby the fabric is wrapped around and adhered to the foam along its length via the use of an adhesive, represented by a hot melt adhesive. The result of this first step 302 is a typical FOF gasket known in the art, the FOF having an indefinite length. In a second step 304, the fabric over foam gasket of the first step is processed by cutting and removing intermittent portions of the FOF to create slots 110, where the foam is substantially completely cut but the bottom portions of the electrically-conductive outer layer 144 are not cut. In this second step, portions of fabric and foam are removed to create a series of alternating FOF sections 108 and slots 110. This may be achieved, for example as seen in the Figure, by feeding the FOF construction through a rotary die cutter, though this is a non-limiting example. Any variety of cutting and removal in the art is embraced to create the gasket 100 of the disclosure. In a third and optional step 306, the length of the gasket may be fed onto a reel. In this way, a long continuous length of gasket 100 may be manufactured by feeding the core and electrically-conductive layer by their lengths down a manufacturing line and adhering one to another via a hot melt, and then, on the same manufacturing line, feeding that FOF into a rotary die cutter to create the slotted gasket, and then winding that slotted gasket onto a reel for use by a customer. However, these steps may take place on separate machines or locations, and the gasket may be cut into sections rather than fed onto a spool or reel, all depending on the end use. In an optional intervening step 308, which may occur at point A or B on the flow diagram of FIG. 10, a pressure sensitive adhesive may be applied along the bottom length of the gasket. In so adding the PSA, the gasket seen in the previously-discussed figures may be manufactured.

In an embodiment, the gasket of the disclosure may be manufactured by providing a resilient foam core and an electrically-conductive outer layer, such as metallized fabric, and wrapping and adhering that outer layer to the core through the application of an adhesive layer having sufficient bond strength to hold the conductive layer to the core under normal function of a typical EMI gasket. This alone would produce a typical EMI FOF gasket known to those of skill in the art. Further, conductive PSA may be applied to the bottom of the FOF gasket to create a typical final EMI FOF product of the art. However, in the present manufacturing embodiment, the gasket undergoes a further subsequent step of the cutting of the gasket at intervals, and the removal of portions of the FOF to create the slots seen throughout the figures. During this cutting and removal, the lower underside portions 144 of the outer conductive layer 104 are not cut, but instead the foam core is sheared off those portions to create the slots 110. However, due to the strength of the adhesive between the outer layer and the core, a residual amount of foam 146 may remain adhered to those lower underside portions of the outer conductive layer.

Gaskets of the disclosure may be manufactured by alternate methods that produce an FOF gasket having an alternating pattern of FOF sections and slots therebetween. For example, individual pieces of FOF contacts could be adhered to a single strip of conductive material, such as electrically-conductive fabric, by adhesive or other mechanisms. Alternatively, the electrically-conductive outer layer may be pre-cut into a pattern and then wrapped around individual sections of core, such as electrically-conductive foam. These and all possible methods for manufacturing a gasket of the disclosure, using any combination of techniques currently known by those of ordinary skill in the art, are embraced.

The shielding effectiveness of the gaskets of the disclosure is comparable to that of similarly-dimensioned FOF gaskets which are lacking the slotted configuration disclosed herein. Similarly, the electrical resistance of gaskets of the disclosure is comparable to non-slotted FOF gaskets in that the resistance decreases as the gasket is compressed. The force required to compress gaskets of the disclosure is understandably lower than that of non-slotted FOF gaskets, in that there is less material to compress down the length of a slotted FOF gasket of the disclosure compared to FOF gaskets having a continuous non-slotted body. With the slots, the individual FOF sections may flex, compress, deform, and/or move inwardly and outwardly substantially independent of one another.

Figure 10:
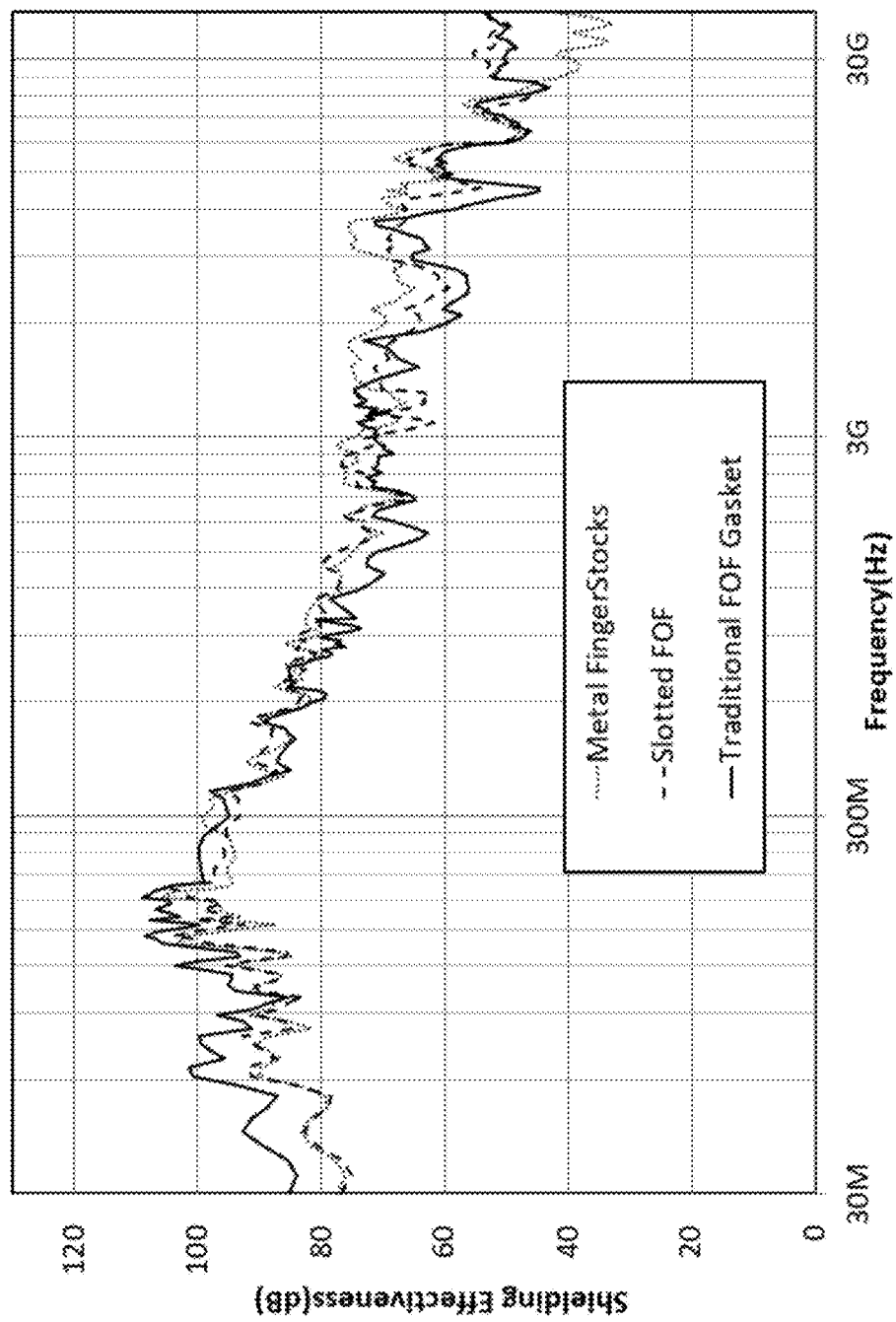
FIG. 10 is a data chart showing shielding performance of a slotted gasket of the disclosure compared to other type gaskets.

More specifically, FIG. 10 is a data chart showing shielding performance of a slotted gasket of the disclosure compared to other type gaskets. The dotted line shows a traditional metal fingerstock type EMI shielding gasket and the solid line shows a traditional FOF gasket. The dashed line shows the shielding performance of a gasket of the disclosure. As can be seen in FIG. 10, the testing data shows that gaskets of the disclosure provide effective EMI shielding across a spectrum of wavelengths which is comparable to other gaskets of the prior art.

Figure 11:
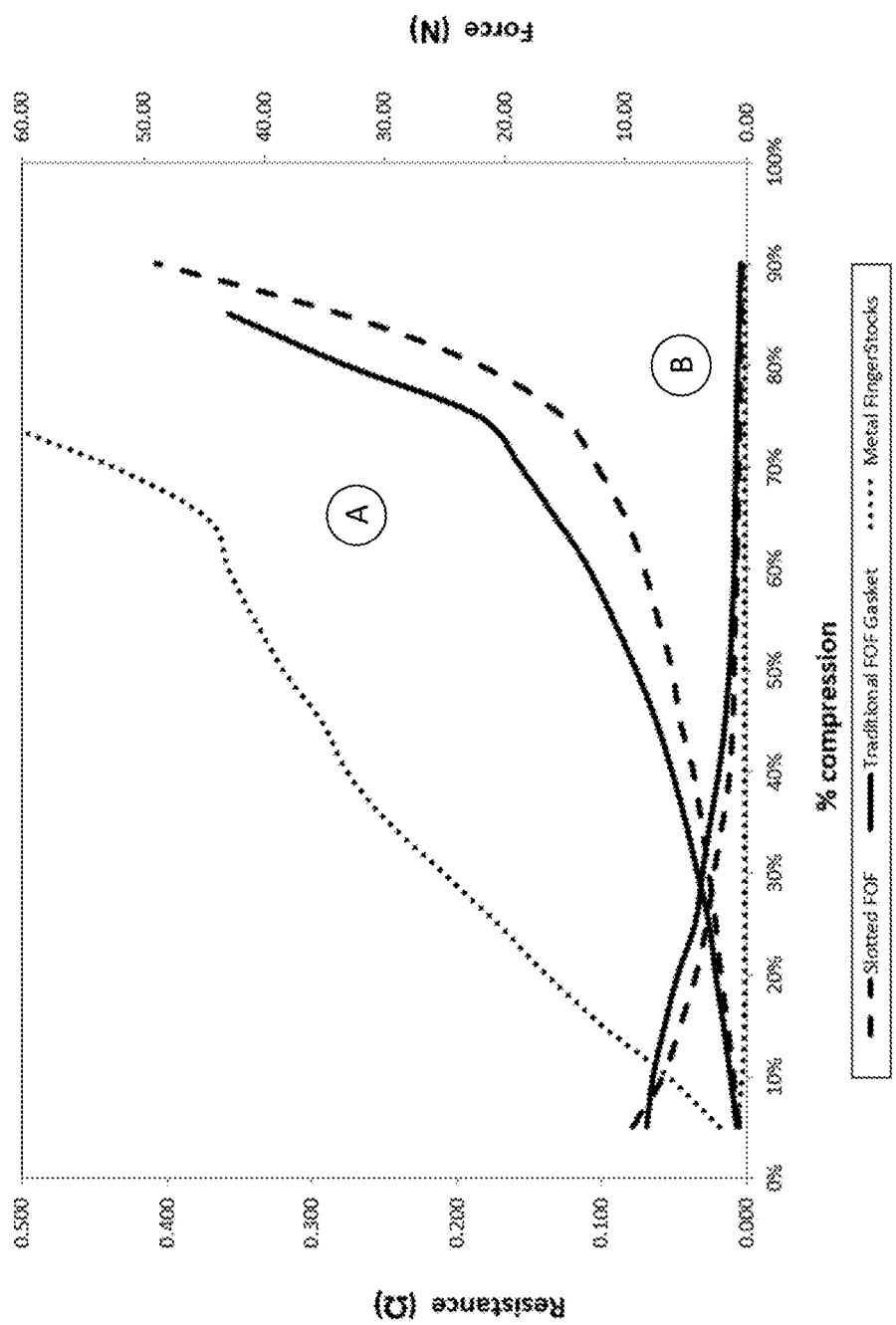
FIG. 11 is a data chart showing electrical resistance and compression forces, at various stages of compression, of a slotted gasket of the disclosure compared to other type gaskets.

Similarly, FIG. 11 is a data chart showing both the compression force and the electrical resistance of EMI shielding gaskets as the gaskets compress. The dotted line shows a traditional metal fingerstock type EMI shielding gasket and the solid line shows a traditional FOF gasket. The dashed line shows a gasket of the disclosure. As can be seen in FIG. 11, the testing data shows that gaskets of the disclosure provide effective EMI shielding comparable to other gaskets of the prior art. Data group A shows increasing force required to compress each gasket, and data group B shows decreasing resistance as the gaskets compress. Data group A shows that, like traditional non-slotted FOF gaskets, the compression forces required are less than that of traditional metal fingerstock type shielding gaskets, however the slotted gasket requires even less compression force than a traditional FOF. Data group B shows similar electrical resistance performance between a traditional non-slotted FOF gasket and a slotted FOF gasket of the disclosure.

The ratio of the FOF section length 134 to the slot length 116 may vary by application. For example, the ratio may be 1:1 in an embodiment. In another embodiment, the ratio may be 2:1 of FOF length 134 to slot length 116. In another embodiment, the ratio of FOF length 134 to slot length 116 may be 3:1, or 4:1, or greater than 4:1.

While the gaskets of the figures include a generally rounded profile on their cross-section or face such as a tombstone or semicircle or capital D shape, all shapes known to those of ordinary skill in the art are embraced by this disclosure, including but not limited to a P-shape, a bell shape, an L-shape, an hourglass shape, a C-fold shape, rectangular, knife-shaped, J-shape, T-shape, as well as inverted or rotated versions thereof, among others.

The foam core of the disclosure is, in an embodiment, a porous material composed of any suitable foam material known in the art in the manufacture to act as a resilient or semi-resilient foam core of FOF EMI gaskets. The foam core may be comprised of open cell foam or closed cell foam, as the end application of the gasket merits. In a non-limiting example, the foam is a urethane foam, such as polyurethane foam.

The electrically-conductive outer layer of the disclosure may be any suitable electrically-conductive wrap known in the art in the manufacture of FOF EMI contacts or gaskets. Non-limiting examples of such layers include nylon ripstop fabrics, mesh fabrics, taffeta fabrics, woven fabrics, nonwoven fabrics, or knitted fabrics that have been coated, impregnated, plated, metallized or otherwise treated with electrically-conductive material to create a flexible wrappable layer that may be wrapped around a foam core. In addition, a metallized film may be used as an electrically-conductive layer. The electrically-conductive material may include, by way of non-limiting examples, copper, nickel, silver, palladium, aluminum, tin, alloys and/or combinations thereof. In an embodiment, the electrically-conductive layer is a woven fabric that has been coated with an alloy of copper and tin. In another embodiment, the electrically-conductive layer is a metal foil of aluminum, copper, tin, or any alloy thereof. In another embodiment, the electrically-conductive layer is nickel plated polyester or taffeta fabric, or nickel/copper plated knit mesh, or nylon ripstock (NRS) fabric coated with nickel and/or copper.

The electrically-conductive layer may be adhered to the foam core through the use of any suitable adhesive known in the art in the manufacture of FOF EMI contacts or gaskets. Ideally the adhesive layer should provide good bond strength between the foam core and the electrically-conductive layer. The adhesive layer should provide proper shielding effectiveness and bulk resistivity for the FOF EMI gasket application. A non-limiting example of such materials is a solvent based polyester adhesive. In an embodiment, the adhesive further includes flame retardant, such as a halogen free flame retardant.

In an embodiment, the FOF EMI gaskets of the disclosure may include an effective amount of flame retardant and be substantially free of halogen, so as to achieve a flame retardance rating pursuant to the Underwriters Laboratories Standard No. 94, "Test for Flammability of Plastic Materials for Parts in Devices and Appliances" (1991). In a more preferred embodiment, the effective amount provides the shielding material with a UL94 flame rating of at least HF-1 or HB. More preferable is a UL94 vertical flame rating of at least VI, N2 or V0. Methods and manufactures of such gaskets are discussed in length in U.S. Pat. No. 7,060,348 and U.S. Pat. No. 8,545,974, both assigned to Laird Technologies, Inc. The entireties of those patents are hereby incorporated by reference as if fully restated herein.

In an embodiment, the FOF EMI gaskets of the disclosure may be considered halogen-free per International Electrotechnical Commission (IEC) International Standard IEC 61249-2-21 (page 15, November 2003, First Edition). International Standard IEC 61249-2-21 defines "halogen free" (or free of halogen) for Electrical and Electronic Equipment Covered Under the European Union's Restriction of Hazardous Substances (RoHS) directive as having no more than a maximum of 900 parts per million chlorine, no more than a maximum of 900 parts per million bromine, and no more than a maximum of 1,500 parts per million total halogens. The phrases "halogen free," "free of halogen," and the like may be similarly used herein.

Gaskets of the disclosure may be used in a wide range of electronic devices and components. By way of example only, exemplary applications include cellular phones, personal communications devices, computers; tables, gaming consoles, printed circuit boards, high frequency microprocessors, central processing units, graphics processing units, laptop computers, notebook computers, desktop computers, computer servers, etc. Accordingly, aspects of the present disclosure should not be limited to use with any one specific type of electronic device.

Thus, a gasket of indefinite length for the mitigation of electromagnetic interference (EMI) has been disclosed. In an embodiment, the gasket includes a series of sections of resiliently compressible core material wrapped in an electrically-conductive outer layer, each section having a base, the sections joined at their bases by strips of the electrically-conductive outer layer. The electrically-conductive outer layer may be electrically-conductive metallized fabric and the resiliently compressible core material may be a foam core. The electrically-conductive metallized fabric may be adhered to the foam core by way of an adhesive. The gasket of the disclosure may include a bottom and a strip of pressure sensitive adhesive adhered thereon along its length.

In an embodiment, the spaces between adjacent sections are slots, the slots and the sections each having respective lengths, where the length of each slot is substantially consistent throughout the length of the gasket and the length of each section is substantially consistent throughout the length of the gasket. Alternatively, the length of each slot and/or the length of each section may be inconsistent or nonuniform throughout the length of a gasket in another embodiment. The ratio of the length of the section to the length of the slot is 1:1 or greater. In another embodiment, the ratio of the length of the section to the length of the slot is 2:1 or greater. In yet another embodiment, the ratio of the length of the section to the length of the slot is 3:1.

In an embodiment, each section may include a face having the shape of a sideways capital D, the straight portion of the capital D being the base of the section.

In an embodiment, each section of the electrically-conductive outer layer in the slots further may include at least some residual foam.

In one embodiment, where the gasket includes a bottom, the electrically-conductive metallized fabric may be wrapped around the foam core such that the electrically-conductive metallized fabric has two bottom portions on the bottom of the gasket, where the bottom portions do not meet and thus result in a gap therebetween. The gasket may, in this embodiment, include a strip of pressure sensitive adhesive adhered to the bottom of the gasket along its length, the strip of pressure sensitive adhesive covering the gap between the bottom portions of the electrically-conductive metallized fabric.

The disclosure embraces an electronic device including the gasket of the disclosure, as well as a reel including the gasket of the disclosure reeled thereon.

The gasket may be substantially free of halogen, and may additionally include an effective amount of flame retardant so as to achieve a flame retardance rating pursuant to the Underwriters Laboratories Standard No. 94 of VU.

In an embodiment, an EMI shielding gasket of indefinite length is disclosed, the gasket having a resilient foam core wrapped in an electrically-conductive outer layer, the gasket having a substantially flat bottom of conductive outer layer, the gasket further comprising a series of slots, wherein each slot is a gap in the gasket where the substantial majority of the foam core and all the electrically-conductive outer layer except that which makes up the bottom of the gasket have been cut and removed from the gasket.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Or for example, the term "about" as used herein when modifying a quantity of an ingredient or reactant of the invention or employed refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture. Whether or not modified by the term "about", the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A gasket of indefinite length for the mitigation of electromagnetic interference (EMI), the gasket comprising a series of sections of resiliently compressible core material wrapped in an electrically-conductive outer layer, each section having a base, the sections joined at their bases by strips of the electrically-conductive outer layer, wherein:

the electrically-conductive outer layer is electrically-conductive metallized fabric, and the resiliently compressible core material is a foam core;

the electrically-conductive metallized fabric is adhered to the foam core by way of an adhesive;

the gasket further comprises a bottom;

the electrically-conductive metallized fabric is wrapped around the foam core such that the electrically-conductive metallized fabric comprises two bottom portions on the bottom of the gasket, where the bottom portions do not meet and thus result in a gap therebetween; and the gasket further comprises a strip of pressure sensitive adhesive adhered to the bottom of the gasket along its length, the strip of pressure sensitive adhesive covering the gap between the bottom portions of the electrically-conductive metallized fabric.

2. The gasket of claim 1, wherein the spaces between adjacent sections are slots, the slots and the sections each having respective lengths, and wherein the ratio of the length of the section to the length of the slot is 1:1 or greater.

3. The gasket of claim 2, wherein the ratio of the length of the section to the length of the slot is 2:1 or greater.

4. The gasket of claim 3, wherein the ratio of the length of the section to the length of the slot is 3:1.

5. The gasket of claim 2, wherein each section of conductive outer layer in the slots further comprises at least some residual foam.

6. The gasket of claim 2, wherein the gasket is substantially free of halogen, and/or wherein the gasket further comprises an effective amount of flame retardant so as to achieve a flame retardance rating pursuant to the Underwriters Laboratories Standard No. 94 of V0.

7. The gasket of claim 1, wherein the gasket is substantially free of halogen, and/or wherein the gasket further comprises an effective amount of flame retardant so as to achieve a flame retardance rating pursuant to the Underwriters Laboratories Standard No. 94 of V0.

8. The gasket of claim 1, each section further comprising a face having the shape of a sideways capital D, the straight portion of the capital D being the base of the section.

9. An electronic device including the gasket of claim 1.

10. A reel including the gasket of claim 1 reeled thereon.

11. An EMI shielding gasket of indefinite length comprising a resilient foam core wrapped in an electrically-conductive outer layer, the gasket having a substantially flat bottom of the electrically-conductive outer layer, the gasket further comprising a series of slots, wherein each slot is a gap in the gasket where the substantial majority of the resilient foam core and all the electrically-conductive outer layer except that which comprises the bottom of the gasket have been cut and removed from the gasket, wherein:

the electrically-conductive outer layer is electrically-conductive metallized fabric adhered to the resilient foam core by way of an adhesive, and wherein the gasket further comprises a bottom and a strip of pressure sensitive adhesive adhered to the bottom of the gasket along its length; and the electrically-conductive metallized fabric is wrapped around the resilient foam core such that the electrically-conductive metallized fabric comprises two bottom portions on the bottom of the gasket, wherein the bottom portions do not meet and thus result in a gap therebetween, wherein the strip of pressure sensitive adhesive covers the gap between the bottom portions of the electrically-conductive metallized fabric.

12. The gasket of claim 11, wherein the gasket further comprises a face having the shape of a sideways capital D, the straight portion of the capital D being a base of the gasket.

13. An EMI shielding gasket of indefinite length comprising a resilient foam core wrapped in an electrically-conductive metallized fabric that is adhered to the resilient foam core by way of an adhesive, the gasket having a substantially flat bottom of the electrically-conductive metallized fabric, the gasket further comprising a series of slots, wherein each slot is a gap in the gasket where the substantial majority of the resilient foam core and all the electrically-conductive metallized fabric except a bottom portion of the electrically-conductive metallized fabric that defines the substantially flat bottom of the gasket have been cut and removed from the gasket, wherein:

the slots and the sections each having respective lengths;
the ratio of the length of the section to the length of the slot is 1:1 or greater;
each section of the electrically-conductive metallized fabric in the slots further comprises at least some residual foam;

the gasket is substantially free of halogen; and
the gasket comprises an effective amount of flame retardant so as to achieve a flame retardance rating pursuant to the Underwriters Laboratories Standard No. 94 of V0;
wherein the electrically-conductive metallized fabric is wrapped around the resilient foam core such that the bottom portion of the electrically-conductive metallized fabric comprises two bottom portions that define the substantially flat bottom of the gasket;
wherein the bottom portions of the electrically-conductive metallized fabric do not meet and thus result in a gap therebetween; and
wherein the gasket further comprises a strip of adhesive adhered to the substantially flat bottom of the gasket along its length, the strip of adhesive covering the gap between the bottom portions of the electrically-conductive metallized fabric.

14. The gasket of claim 13, wherein the residual foam has a height substantially the same as a thickness of the electrically-conductive metallized fabric.

15. The gasket of claim 13, wherein the slots extend across an entire width of the gasket.

16. The gasket of claim 13, wherein the slots have open end portions along each side of the gasket.

17. The gasket of claim 13, wherein the slots extend across an entire width of the gasket such that the slots have open end portions along each side of the gasket.

* * * * *